United States Patent
Amari

(10) Patent No.: US 8,654,804 B2
(45) Date of Patent: Feb. 18, 2014

(54) OPTICAL TRANSMITTER WITH STABLE OUTPUT WAVELENGTH

(75) Inventor: Shogo Amari, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/584,146

(22) Filed: Aug. 13, 2012

(65) Prior Publication Data

US 2013/0044777 A1 Feb. 21, 2013

(30) Foreign Application Priority Data

Aug. 19, 2011 (JP) ................................. 2011-179819

(51) Int. Cl.
*H01S 3/04* (2006.01)

(52) U.S. Cl.
USPC ......... 372/36; 372/34; 372/38.01; 372/38.02; 372/38.07

(58) Field of Classification Search
USPC ...................... 372/36, 34, 38.01, 38.02, 38.07
See application file for complete search history.

(56) References Cited

U.S. PATENT DOCUMENTS

| 5,754,574 | A  | * | 5/1998  | Lofthouse-Zeis et al. ...... 372/34 |
| 7,535,940 | B2 | * | 5/2009  | Kawagishi et al. ............. 372/34 |
| 7,899,337 | B1 |   | 3/2011  | Tanaka et al. |
| 2004/0022543 | A1 | * | 2/2004 | Hosking et al. ............... 398/135 |
| 2004/0161248 | A1 | * | 8/2004 | Stewart et al. ................ 398/196 |
| 2006/0083275 | A1 | * | 4/2006 | Stewart et al. ................ 372/34 |
| 2007/0047603 | A1 | * | 3/2007 | Oomori ......................... 372/34 |
| 2008/0273561 | A1 | * | 11/2008 | Fu et al. ........................ 372/34 |
| 2009/0080903 | A1 | * | 3/2009 | Moriyasu ...................... 398/182 |

OTHER PUBLICATIONS

Computer Dictionary, 1997, Microsoft Press, Third edition, p. 198.*

* cited by examiner

*Primary Examiner* — Kinam Park
(74) *Attorney, Agent, or Firm* — Venable LLP; Michael A. Sartori; Tamatane J. Aga

(57) ABSTRACT

An optical transmitter is disclosed, where the optical transmitter shows an emission wavelength kept stable in one of grid wavelengths of the WDM system during the boot of the transmitter. The optical transmitter includes an LD, a TEC to control a temperature of the LD, and a controller. Detecting the flag to enable the optical output, the controller increases the driving current of the LD concurrently with the decrease of the temperature of the TEC to compensate the self-heating of the LD due to the driving current.

8 Claims, 5 Drawing Sheets

OPTICAL TRANSMITTER WITH STABLE OUTPUT WAVELENGTH

BACKGROUND OF THE INVENTION

1. Field of the Invention

The present invention relates to an optical transmitter, in particular, the invention relates to an optical transmitter with stable output wavelength applicable to a wavelength division multiplexing (WDM) system.

2. Related Prior Arts

An optical transmitter implemented with a semiconductor laser diode (hereafter denoted as LD) has been well known and applied to the WDM system. A United States Patent, the U.S. Pat. No. 7,899,337, has disclosed an optical transmitter with a function to increase an output thereof stepwise to a target level.

SUMMARY OF THE INVENTION

One aspect of the present invention relates to an optical transmitter that includes an LD, a thermo-electric cooler (hereafter denoted as TEC), an LD-Driver, a TEC-Driver, and a controller. A feature of the invention is that the controller controls the LD-Driver and the TEC-Driver synchronous with the detection of a flag to enable the optical output from the optical transmitter by increasing the driving current for the LD and decreasing the temperature of the TEC stepwise to respective target values.

Because the temperature of the LD is lowered during the increase of the driving current, the self heating by the driving current is compensated, which keeps the emission wavelength substantially in constant in one of the grid wavelengths of the WDM system.

Another aspect of the invention relates to a method to control an optical transmitter for the WDM system. The method includes steps of: detecting a flag to enable the optical output of the optical transmitter; increasing a driving current provided to the LD stepwise to a target current, while, decreasing a temperature of the TEC to a target temperature synchronous with the increase of the driving current. Because the temperature of the LD is lowered during the increase of the driving current provided thereto, the self-hating by the driving current is suppressed, or substantially eliminated.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF PREFERRED EMBODIMENTS

Next, some preferred embodiments according to the present invention will be described as referring to drawings. In the description of the drawings, numerals or symbols same or similar to each other will refer to the elements similar or same to each other without overlapping explanations.

Figure 1:
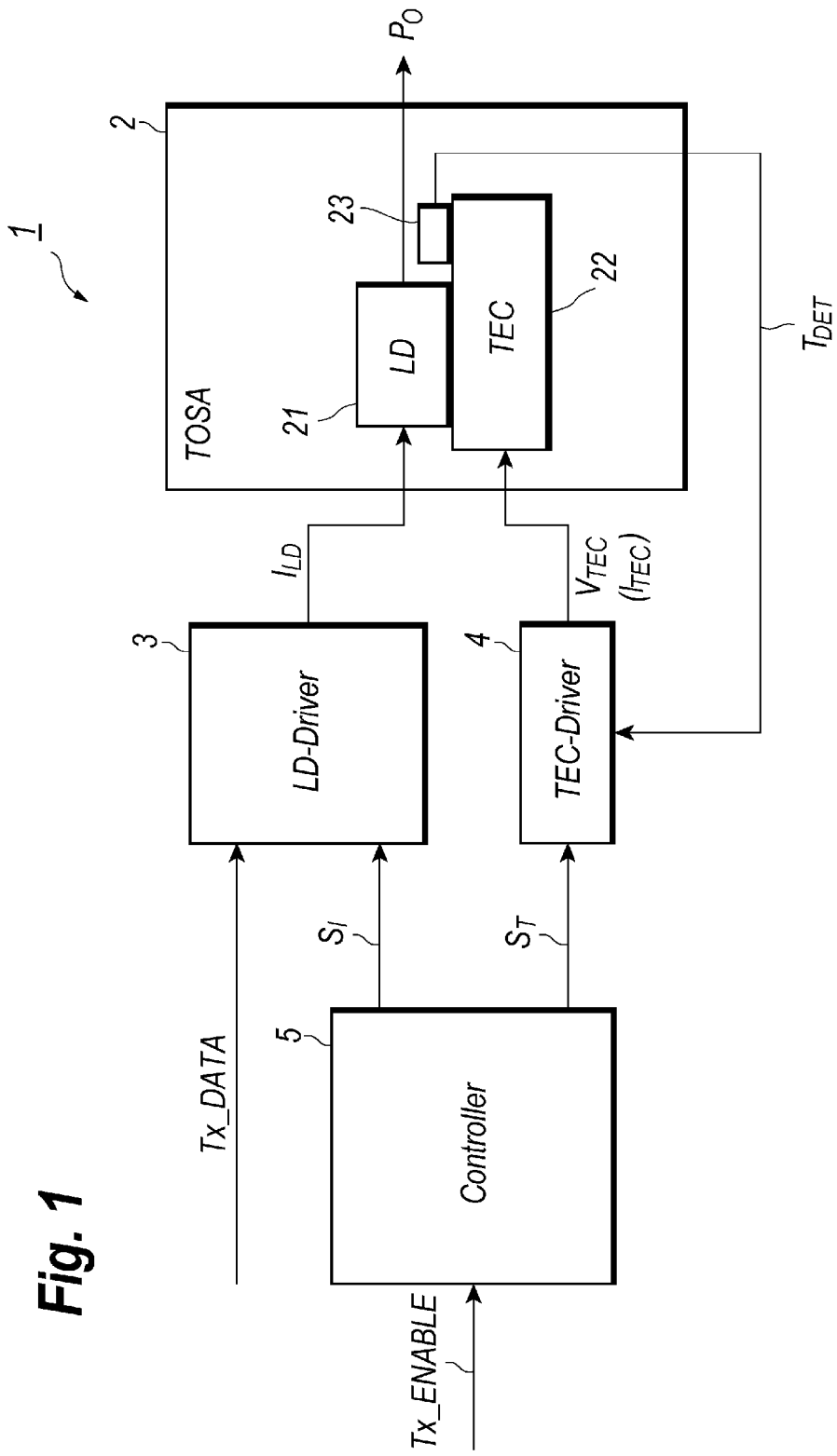
FIG. 1 shows a block diagram of an optical transmitter according to an embodiment of the invention.

FIG. 1 is a functional block diagram of an optical transmitter according to an embodiment of the invention. The optical transmitter 1 includes a transmitter optical sub-assembly (hereafter referred to TOSA) 2, an LD-driver 3, a driver for a thermo-electrical cooler (hereafter referred to TEC-Driver) 4, and a controller 5.

The TOSA 2, which generates an optical output $P_o$, includes the LD 21, a thermister 23 as a temperature sensor, and a TEC 22 on which the LD 21 and the thermister 23 are mounted. The LD 21 receives a driving signal $I_{LD}$ from the LD-Driver 3 to generate the optical output $P_o$. The TEC 22 controls a temperature $T_{LD}$ of the LD 21 by receiving another driving signal $V_{TEC}$, or a driving current $I_{TEC}$ from the TEC-Driver 4. The thermister 23 senses the temperature $T_{LD}$ of the LD indirectly by being placed on the TEC 22 and generates a sensed signal $T_{DET}$ provided to the TEC-Driver 4.

The LD-Driver 3, as described above, provides the driving current ILD to the LD 21. Specifically, the LD-Driver 3 determines the magnitude of the driving current ILD based on a control signal SI output from the controller 5. The driving current ILD includes a bias current having substantially DC or low-frequency component and a modulation current having switched components. That is, the LD-Driver 3 varies the bias current primarily based on the control signal SI provided from the controller 5, while, superposes the modulation current on the bias current, where the modulation current takes two states of ON and OFF reflecting the data Tx_DATA input to the transmitter 1.

The TEC-Driver 4 controls the temperature of the TEC 22. Specifically, the TEC-Driver 4, receiving from the controller 5 the control signal $S_T$ that indicates a target temperature of the TEC 22 and from the thermister 23 a monitored signal $T_{DET}$, compares the latter signal $T_{DET}$ with the former signal $S_T$ and provides to the TEC 22 a driving signal $V_{TEC}$ to eliminate a difference between two signals, $S_T$ and $T_{DET}$.

The controller 5, as described above, provides to the LD-Driver 3 the control signal $S_I$ to control the driving current $I_{LD}$ provided to the LD 21, while, to the TEC-Driver 4 the other control signal $S_T$ to set the temperature $T_{TEC}$ of the TEC 22 to be equal to the target temperature. A feature of the controller 5 according to the present embodiment is that the controller 5, when a status flag Tx_ENABLE, which instructs the optical transmitter 1 to enable the optical output $P_O$ thereof, is detected; increases the driving current $I_{LD}$ stepwise by the control signal $S_I$ while lowers the temperature $T_{TEC}$ of the TEC 22 stepwise by the other control signal $S_T$.

Figure 2:
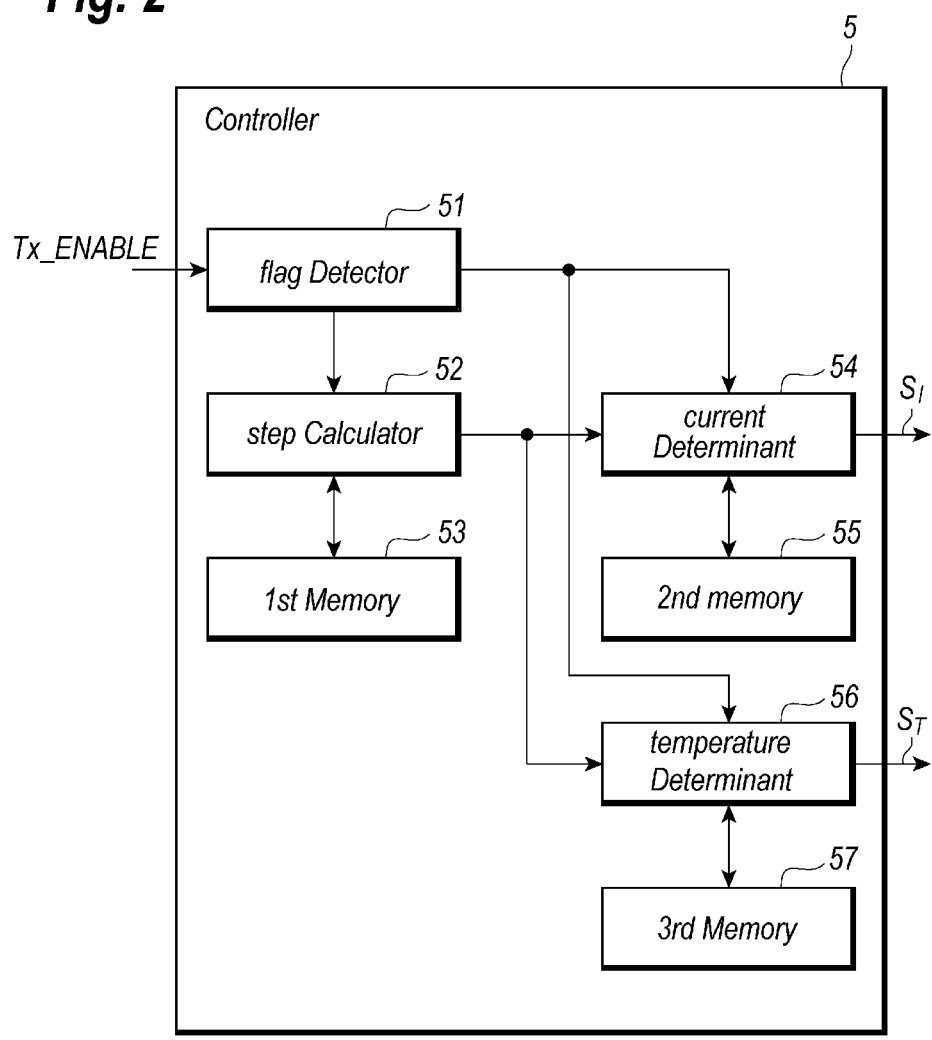
FIG. 2 shows a functional block diagram of a controller implemented within the optical transmitter shown in FIG. 1.

Next, the functions of the controller 5 will be described. FIG. 2 shows the functional block diagram of the controller 5, where the controller 5 is regarded to include a flag detector 51 to detect the flag Tx_ENABLE, a step calculator 52 to calculate the number of the steps, a first memory 53 to store the step conditions, a current determinant 54 to set the control signal $S_I$ to the LD-Driver 3, a second memory 55 to store the conditions of the driving current $I_{LD}$, a temperature determinant 56 to set the other control signal $S_T$ for the TEC-Driver 4, and a third memory 57 to store the temperature conditions around the TEC 22.

The flag detector 51 detects the status flag Tx_ENABLE which indicates that the optical transmitter 1 is to be activated to output the optical signal $P_O$. The flag detector 51, responding to the assertion of the flag Tx_ENABLE, triggers the step calculator 52, the current determinant 54, and the temperature determinant 56.

The step calculator 52 calculates the number of steps to increase the driving current $I_{LD}$ and to lower the temperature $T_{TEC}$ of the TEC 22 stepwise during a transition period beginning with the assertion of the flag Tx_ENABLE. The transition period $\tau_a$ is able to be preset, which is typically 10 seconds, and stored in the first memory. The first memory 53 also stores a period $\tau_s$ for each of the steps. The step period $\tau_s$ is selected such that the shift of the output wavelength of the transmitter 1 during the transition period $\tau_a$ satisfies the range admitted in the standard of the WDM system not to cause the wrong transmission. The step period $\tau_s$ is preferably set to be, for instance, 5 ms.

The step calculator 52, when the flag detector 51 triggers by the assertion of the flag Tx_ENABLE, calculates the number of steps based on the transition period $\tau_a$ and the step period $\tau_s$ each stored in the first memory 53. The step calculator 52 derivers the number of the steps simply by a division process between the transition period $\tau_a$ and the step period $\tau_s$. The step calculator 52 transmits the number of steps thus calculated and the step period $\tau_s$ to the current determinant 54 and the temperature determinant 56.

The first memory 53 store the transition period $\tau_a$ and the step period $\tau_s$. The optical transmitter 1 of the present embodiment fixes the step period $\tau_s$, while, the transition period $\tau_a$ may be varied during the initialization of the optical transmitter 1. Accordingly, when the transition period $\tau_a$ is permanently fixed in, for instance, a non-volatile memory, the number of the steps may be stored in the first memory 53; while, as described above, when the transition period $\tau_a$ is temporally defined, the controller 5 is preferable to re-calculate the number of the steps for every assertion of the flag Tx_ENABLE.

The current determinant 54 generates the control signal $S_I$ for the LD-Driver 3. Specifically, the current determinant 54, when it is triggered by the flag detector 51, begins to increase the control signal $S_I$ stepwise from the one corresponding to the initial current $I_0$ to the target current $I_T$ with the step period $\tau_s$ determined by the step calculator 52. That is, the current determinant 54, responding to the assertion of the flag Tx_ENABLE, reads a target condition of the driving current $I_{LD}$ from the second memory 55; then, calculates the increment $\Delta I_{LD}$ of the driving current by dividing a difference between thus read target condition $I_T$ and the present condition $I_0$ for the driving current $I_{LD}$ by the number of the steps. Thus, the increment $\Delta I_{LD}$ is determined. Subsequently, the current determinant 54 adds the increment $\Delta I_{LD}$ to the current condition for each step, and outputs the control signal $S_I$ corresponding to thus evaluated current $I_{LD}$. Thus, the driving current $I_{LD}$ is increased stepwise from the initial value $I_0$ to the target current $I_T$.

The temperature determinant 56 generates the other control signal $S_T$ provided to the TEC-Driver 4. Specifically, the temperature determinant 56, when the flag detector 51 detects the flag Tx_ENABLE, generates the second control signal $S_T$ provided to the TEC-Driver 4 to lower the temperature $T_{TEC}$ of the TEC 22 stepwise from the initial temperature $T_0$ to the target temperature $T_T$. That is, the temperature determinant 56, responding to the trigger provided from the flag detector 51, firstly reads two conditions each corresponding to the initial temperature $T_0$, or the current temperature, and the target temperature $T_T$ from the third memory 57, secondly calculates a magnitude of the decrement $\Delta T$ by dividing the difference between two read data, $T_0$ and $T_T$, by the number of the steps provided from the step calculator 52, reduces the current control signal $S_T$ by the decrement $\Delta T$, and outputs thus lowered control signal $S_T$ to the TEC-Driver 4. The third memory 57 stores information corresponding to the current temperature $T_{TEC}$ and the target temperature $T_T$ of the TEC 22, respectively.

Although FIG. 2 schematically illustrates respective functional units, 51 to 57, as a unit independent from others; each units, 51 to 57, may be implemented in a form of software or firmware.

Figure 3:
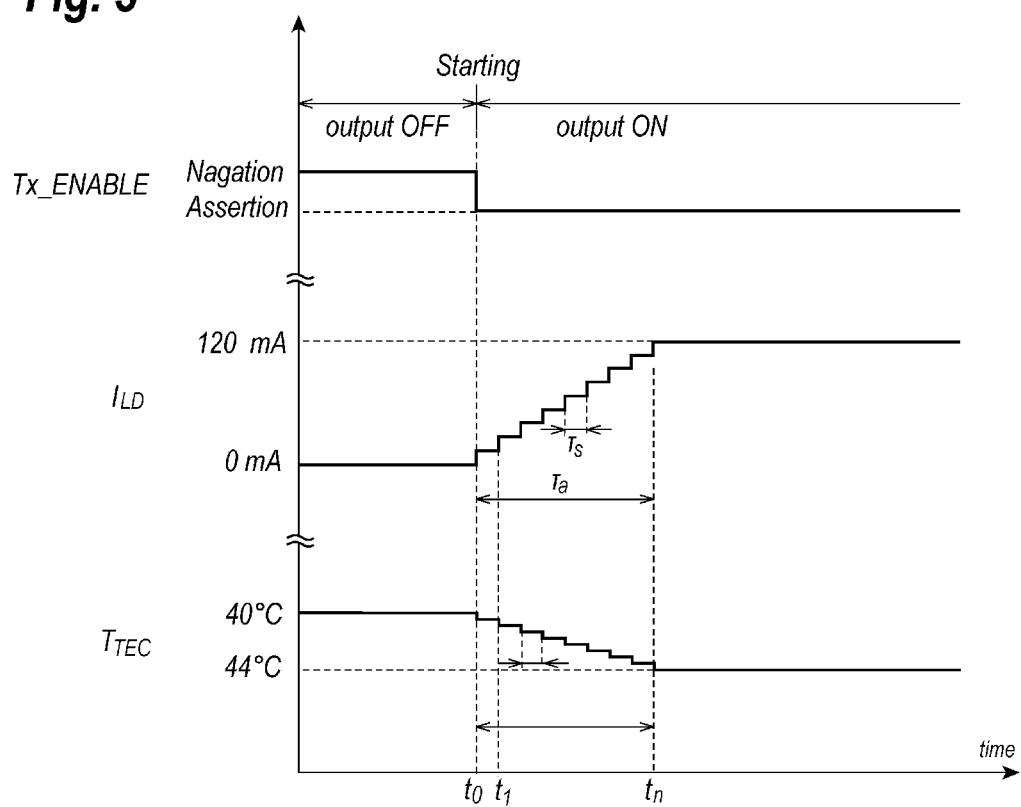
FIG. 3 shows time charts of the flag Tx_ENABLE, the driving current $I_{LD}$ for the LD, and the temperature $T_{TEC}$ of the thermoelectric controller.
Figure 4:
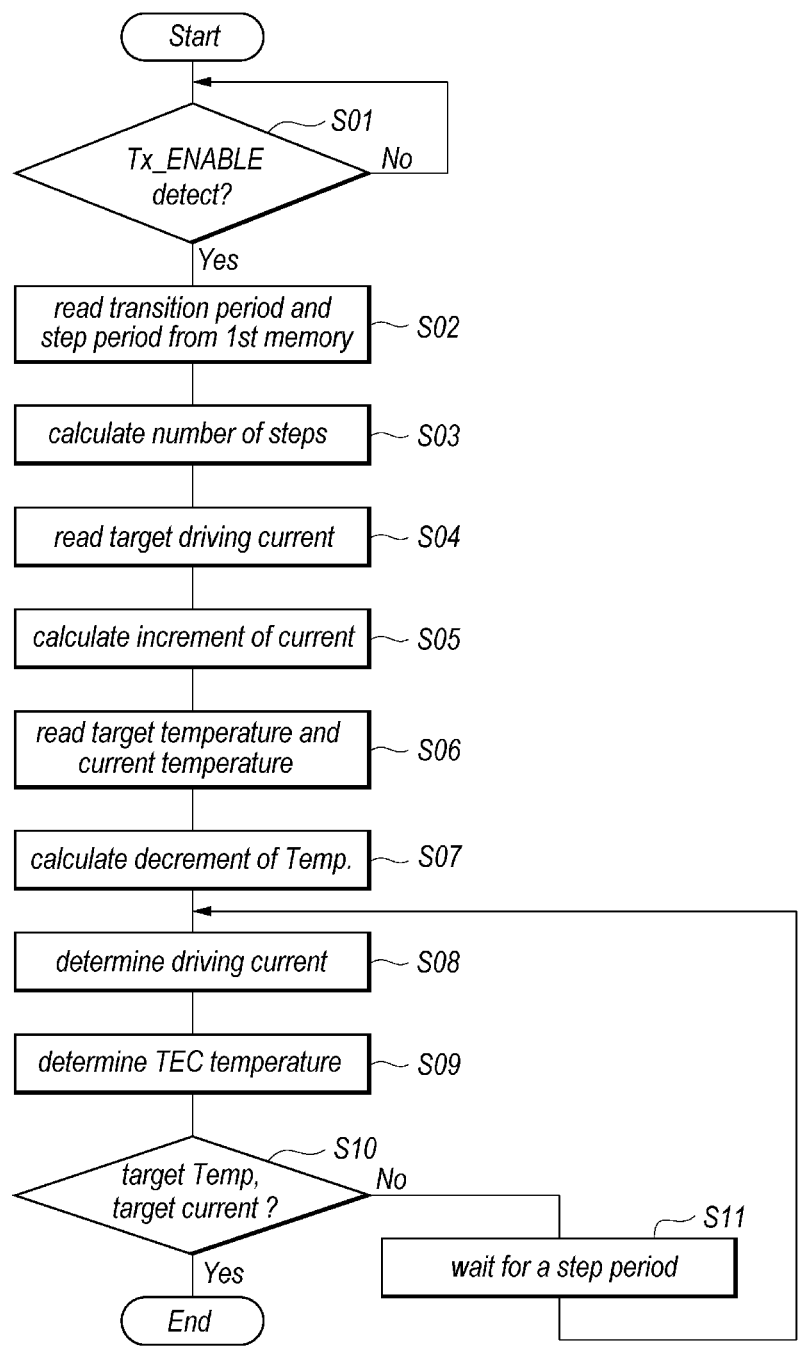
FIG. 4 is a flow chart of the controller shown in FIG. 1 during the transition period triggered by the flag Tx_ENABLE.

Next, an operation of the optical transmitter 1 will be described as referring to FIGS. 3 and 4. FIG. 3 is time charts of the flag Tx_ENABLE, the driving current $I_{LD}$, and the temperature $T_{TEC}$ of the TEC 22; while, FIG. 4 shows a flow charts to control the optical transmitter 1. In an embodiment shown in FIG. 3, the initial current $I_0$ is set to be 0 mA, while the initial temperature $T_0$ and the target temperature $T_T$ are assumed to be 44° C. and 40° C., respectively.

The control sequence shown in FIG. 4 first decides whether the flag Tx_ENABLE is asserted or not by the flag detector 51 as step S01. The flag Tx_ENABLE is negated or disabled for a period before instant $t_0$ in FIG. 3, which corresponds to the status NO in FIG. 4, the control sequence iterates the detection of the assertion of the flag Tx_ENABLE. The flag Tx_ENABLE is asserted at time $t_0$, which is detected by the flag detector 51, the control sequence proceeds step SO2 for the flag detector 51 triggering the step calculator 52 and two determinants, 54 and 56.

The step calculator 52, responding to the trigger provided from the flag detector 51, reads the transition period $\tau_a$ and the step period $\tau_s$ from the first memory 53, calculates the number of the steps by dividing the transition period $\tau_a$ by the step period $\tau_s$, at step S03, and provides the number of the steps thus calculated to respective determinants, 54 and 56.

The current determinant 54, responding to the trigger of the flag detector 51, reads the target condition from the second memory at step S04, receives the number of the steps from the step calculator 52, and calculates the increment $\Delta I_{LD}$ of the driving current $I_{LD}$ by dividing the difference of two current conditions by the number of the steps at S05.

Concurrently with the current determinant 54, the other determinant 56 for the temperature, also responding to the trigger of the flag detector 52, reads the target condition from the third memory at step S06, receives the number of the steps from the step calculator 52, and calculates the decrement of the temperature $\Delta T_{TEC}$ by dividing the difference of two conditions, each corresponding to the present temperature and the target temperature of the TEC 22, by the number of the steps, at step S07.

Then, the current determinant 54 increases the control signal $S_I$ by adding the value corresponding to the increment $\Delta I_{LD}$, and provides thus revised control signal $S_I$ to the LD-Driver 3 at step S08. Concurrently, the temperature determinant 56 decreases the second control signal $S_T$ by reducing the value corresponding to the decrement $\Delta T_{TEC}$, and provides thus revised signal $S_T$ to the TEC-Driver 4 at step S09. Thus, the steps S02 to S09 are carried out after the instant $t_0$, the driving current $I_{LD}$ becomes $I_{LD}+\Delta I_{LD}$, while, the temperature $T_{TEC}$ of the TEC 22 becomes $T_0-\Delta T$ (=44-$\Delta T$)° C. The control sequence checks whether the control signal $S_I$ reaches the target one corresponding to the target current $I_T$ and the other control signal $S_T$ reaches the other target one $T_T$ at step S10. Because the control signal $S_I$ is less than the value corresponding to the target current $I_T$, and the other control signal $S_I$ exceeds the value corresponding to the target temperature $T_T$, two determinants, 54 and 56, wait for the next step begging at the instant $t_0+\tau_s$ at step S11.

At a time $t_1=t_0+\tau_s$, the current determinant 54 further increases the control signal $S_I$ by the value corresponding to the current increment $\Delta I_{LD}$ to output thus increases control signal $S_I$ to the LD-Driver 3 at step S08. Concurrently, the temperature determinant 56 further decreases the second control signal $S_T$ by the value corresponding to the temperature decrement $\Delta_{TEC}$ and provides thus decreased control signal $S_T$ to the TEC-Driver 22 at step S09. Thus, during the period $\tau_s$ begging from the instant $t_1$, the driving current $I_{LD}$ becomes $\Delta I_{LD} \times 2$ [mA], while, the temperature $T_{TEC}$ of the TEC 22 becomes $44-2\times\Delta T_{TEC}$. The control sequence decides whether the control signal $S_I$ reaches the value corresponding to the target current $I_T$, and the other control signal $S_T$ reaches the other target one for the temperature $T_T$ again at step S10. When two control signals, $S_I$ and $S_T$, yet reach respective target values, the control sequence waits for the next instant $t_1+\tau_s$ at step S11. Thus, two determinants, 54 and 56, iterate the sequences S02 to S11 until two control signals, $S_I$ and $S_T$, becomes respective target values at the instant $t_n$.

At the instant $t_n$, the current determinant 54 further increases the control signal $S_I$ by the value corresponding to the current increment $\Delta I_{LD}$ to provide the control signal to the LD-Driver 3, while, the temperature determinant 56 further decreases the second control signal $S_T$ by the other value corresponding to the temperature decrement $\Delta T_{TEC}$ to provide thus revised control signal $S_T$ to the TEC-Driver 4. Then, the driving current $I_{LD}$ reaches the target current $I_T$ (=120 mA) and the TEC temperature $T_{TEC}$ reaches the target temperature $T_T$ (=40° C.). Because two control signals, $S_I$ and $S_T$, reach their target values, the control sequence proceeds step S10 where the current determinant stores in the second memory 55 the control signal $S_I$ in the present value and the temperature determinant stores in the third memory 57 the other control signal $S_T$.

Although the flow chart shown in FIG. 4 indicates that steps S06 and S07 are sequentially carried out after steps SO4 and S05; steps S06 and S07 are preferably carried out concurrently with steps S04 and S05. Also, step S09 is sequentially processed after step S08, but two steps S08 and S09 are preferably carried out in parallel.

Figure 5:
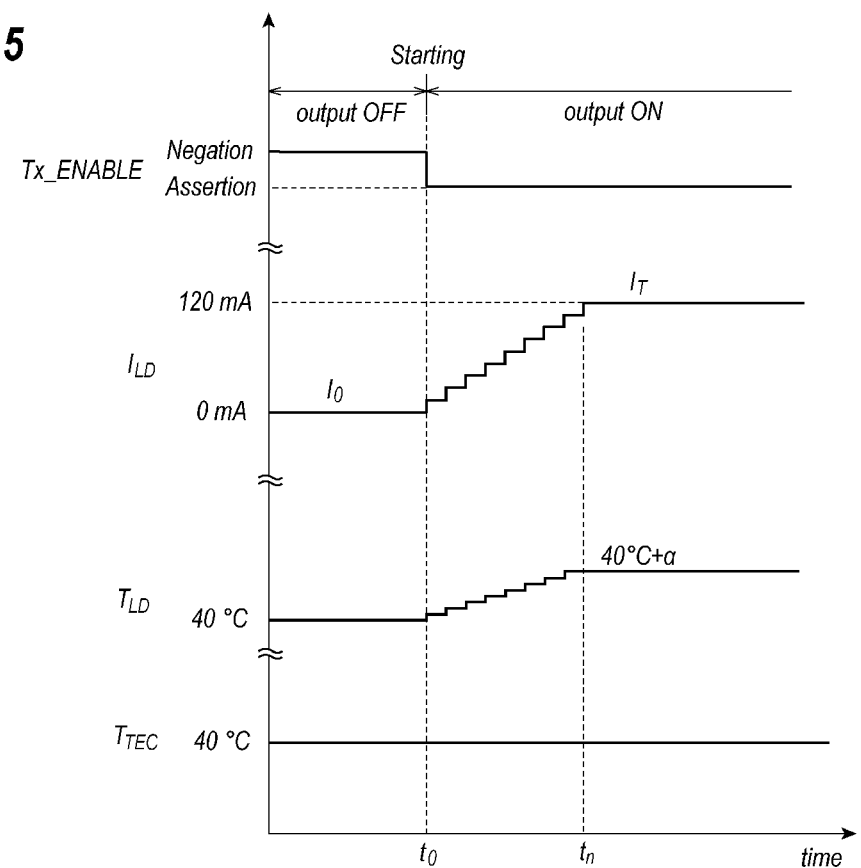
FIG. 5 shows time charts of the flag Tx_ENABLE, the driving current $I_{LD}$, a temperature $T_{LD}$ of the LD, and the temperature $T_{TEC}$ of the TEC of an optical transmitter comparable to that shown in FIG. 1.

Next, innovative features of the optical transmitter 1 will be described. FIG. 5 shows time charts of signals; that is, the flag Tx_ENABLE, the driving current $I_{LD}$, the temperature $T_{LD}$ of the LD, and the temperature $T_{TEC}$ of the TEC; according to an optical transmitter comparative to the embodiment of the present optical transmitter 1. In a comparative example shown in FIG. 5, the initial current $I_0$ and the target current $I_T$ are assumed to be 0 mA and 120 mA, respectively. As shown in FIG. 5, the comparable optical transmitter keeps the temperature $T_{TEC}$ of the TEC 22 in constant at 40° C. by the feedback control loop of the TEC 22, the thermister 23, and the TEC-Driver 4; because the thermister 23 may sense the temperature of the TEC 22 directly but sense the temperature of the LD 21 indirectly through the TEC 22. Accordingly, when the target temperature is set in a constant value, only the temperature of the TEC 22 may be kept in the target temperature.

At the instant $t_0$ when the flag Tx_ENABLE is asserted, the driving current $I_{LD}$ increases stepwise from the initial value $I_0$ to the target value $I_T$ during the transition period from $t_0$ to $t_n$. In FIG. 5, the initial current $I_0$ is assumed to be 0 mA, while, the target current $I_T$ is set to be 120 mA. The LD 21 in a temperature thereof depends on a current provided thereto due to the self heating. That is, when the driving current $I_{LD}$ increases, the temperature of the LD 21 increases, while, the temperature decreases when the driving current reduces. In an exemplary LD, the temperature increases by about 1° C. for the increase of the driving current $I_{LD}$ by about 30 mA, and lowers by about 1° C. for the decrease of the current of 30 mA. Accordingly, even when the LD 21 is controlled in a temperature thereof by the TEC 22, the temperature of the LD 22 itself slightly depends on the driving current $I_{LD}$ provided thereto. When the TEC 22 in the temperature thereof is kept in 40° C. and the LD 21 is provided in the driving current of 120 mA, the temperature $T_{LD}$ of the LD 21 becomes slightly higher than 40° C., $(40+\alpha)$° C.

The emission wavelength of the LD 21 also depends on the temperature thereof. For instance, the emission wavelength of the LD 21 has the temperature dependence of 100 pm/° C.; that is, when the temperature of the LD increases by 1° C., the emission wavelength thereof becomes longer by about 100 pm. Because the target temperature of the TEC, which is 40° C. in the example shown in FIG. 5, is determined such that the LD 21 may emit light with the target wavelength under a condition of the driving current $I_{LD}$ of 120 mA, that is, the target wavelength is obtainable when the temperature of the LD becomes 40° C.+$\alpha$.

Accordingly, when the LD 21 is initially provided with the driving current $I_{LD}$, that is, the temperature of the LD 21 is substantially 40° C., the emission wavelength thereof is shorter than the target wavelength by about 400 pm. Increasing the driving current $I_{LD}$ to reach the target value of 120 mA, the emission wavelength becomes close to the target wavelength, and finally becomes substantially equal to the target wavelength after the driving current is increased to 120 mA and kept thereat.

When such a comparable optical transmitter is applied to the WDM system, the optical signal output from this optical transmitter sometimes affects signal conditions of neighboring channels. Although the optical power of the comparable transmitter is small during the transition period from the starting thereof to the stable operation thereof, the wavelength of the optical signal output from the optical transmitter is shifted from the target wavelength defined in the system.

On the other hand, the present optical transmitter, as shown in FIG. 3, the temperature $T_{TEC}$ of the TEC 22 is set slightly higher, by about 4° C., than the target temperature $T_T$ during the flag Tx_ENABLE is negated, that is, the period when the driving current $I_{LD}$ is not provided to the LD 21. Then, as the optical output $P_O$ is activated synchronous with the increase of the driving current $I_{LD}$ stepwise, the temperature $T_{TEC}$ of the TEC 22 is lowered stepwise to the target temperature. During the transition period $\tau_a$, the LD 21 is exposed to both conditions of the heating due to the driving current and the cooling by the TEC 22. However, those two conditions are cancelled and the temperature $T_{LD}$ of the LD 21 is kept substantially constant.

The optical transmitter 1 of the embodiment sets the initial driving current $I_{LD}$ to be 0 mA, while, it is set to be 120 mA in the final driving current in a steady state. That is, the temperature $T_{LD}$ of the LD 21 rises about 4° C. in the steady state without any temperature controllers. However, the TEC 22 of the optical transmitter 1 lowers the target temperature thereof by 4° C. during the transition period $\tau_a$, which compensates the increase of the temperature of the LD 21. Thus, the substantial temperature $T_{LD}$ of the LD 21 is kept constant from the triggering of the flag Tx_ENABLE to the steady state, which suppresses or eliminates the shift in the emission wavelength of the optical output $P_O$, and the optical transmitter 1 is stably applicable to the WDM communication system.

In the foregoing detailed description, the optical transmitter of the present invention has been described with reference to specific exemplary embodiments thereof. However, it is evident that various modifications and changes may be made thereto without departing from the broader spirit and scope of the present invention.

For instance, although the embodiment uses the flag Tx_ENABLE to trigger the LD-Driver 3 and the TEC-Driver 4, the optical transmitter 1 may use another flag Tx_DISABLE. In this case, the controller 5 triggers the LD-Driver 3, the TEC-Driver 4, and/or the step calculator 52 and so on at the negation of the Tx_DISABLE. Also, the step calculator 52 starts to count the number of steps during the transition period $\tau_a$, but the controller 5 may preset the number of steps in advance to the practical operation of the controller, or fix the number of steps. In this case, the controller 5 is unnecessary to provide the step calculator 52 and the first memory 53.

Also, the controller 5 of the embodiment increases the driving current $I_{LD}$ stepwise and decreases the temperature $T_{TEC}$ of the TEC stepwise. However, the increase of the driving current $I_{LD}$ and the decrease of the temperature are continuously carried out. Only a condition is necessary that the increase of the driving current $I_{LD}$ and the decrease of the temperature are carried out during the transition period $\tau_a$.

The initial temperature $T_0$ of the TEC 22, which is set to be 44° c in the embodiment, is an optional. That is, the initial temperature $T_0$ is selected by processes of (i) setting the emission wavelength of the LD 21 to the target wavelength under a condition where the target optical power $P_0$ is output, (ii) inactivating the TEC-Driver 4 to stop the temperature control by the TEC 22, (iii) measuring the shift of the emission wavelength of the LD 21, and (iv) evaluating the compensating temperature to cause the wavelength shift; then, the initial temperature $T_0$ may be set to be equal to this compensating temperature. Thus, the present specification and figures are accordingly to be regarded as illustrative rather than restrictive.

What is claimed is:

1. An optical transmitter, comprising:
   a semiconductor laser diode (LD) configured to generate an optical output responding to a driving current applied thereto;
   a thermo-electric cooler (TEC) configured to control a temperature of the LD;
   an LD-Driver configured to provide the driving current to the LD;
   a TEC-Driver configured to drive the TEC; and
   a controller including a flag detector, a current determinant, a temperature determinant, and a step calculator, the flag detector detecting a flag to enable the optical output of the optical transmitter, the current determinant setting a first control signal in the LD-Driver, the temperature determinant setting a second control signal in the TEC-Driver,
   wherein the controller, synchronous with a detection of the flag to enable the optical output by the flag detector, increases the first control signal from a first current level to a first target level during a transition period in stepwise by a number calculated by dividing the transition period by a preset step period by the step calculator triggered by the detection of the flag, and decreases the second control signal from a second current level to a second target level in stepwise by the number.

2. The optical transmitter of claim 1,
   wherein the controller further includes a first memory to store the first current level and the first target level, and a second memory to store the second current level and the second target level,
   wherein the current determinant reads the first current level and the first target level from the first memory triggered by the detection of the flag to enable the optical output to increase the first control signal from the first current level to the first target level in stepwise, and
   wherein the temperature determinant reads the second current level and the second target level from the second memory triggered by the detection of the flag to enable the optical output to decrease the second control signal from the second current level to the second target level in stepwise.

3. The optical transmitter of claim 2,
   wherein the second target level causes a temperature drop with respect to the second current level to compensate an increase in a temperature of the LD by the driving current corresponding to the first target level.

4. The optical transmitter of claim 2,
   wherein the controller further includes a third memory configured to store the preset step period and the transition period.

5. A method to control an optical output of an optical transmitter, comprising steps of:
   detecting a flag to enable the optical output of the optical transmitter;
   calculating a number of steps by dividing a transition period by a preset step period;
   increasing a driving current to a target current in stepwise by the number during the transition period, the driving current being provided to a semiconductor laser diode (LD) to generate the optical output; and
   decreasing a temperature of a thermo-electric controller (TEC) in stepwise by the number during the transition period to a target temperature concurrently with the increase of the driving current.

6. The method of claim 5,
   wherein the LD is compensated in a self heating thereof due to the target current at a preset value corresponding to the target temperature.

7. The method of claim 5,
   wherein the optical transmitter emits light with an emission wavelength substantially constant during the transition period.

8. The method of claim 7,
   wherein the emission wavelength corresponds to one of grid wavelengths of a wavelength division multiplexing (WDM) system.

* * * * *